United States Patent
Tiku et al.

(10) Patent No.: US 9,422,621 B2
(45) Date of Patent: Aug. 23, 2016

(54) REFRACTORY METAL BARRIER IN SEMICONDUCTOR DEVICES

(71) Applicant: SKYWORKS SOLUTIONS, INC., Woburn, MA (US)

(72) Inventors: Shiban Kishan Tiku, Camarillo, CA (US); Viswanathan Ramanathan, Thousand Oaks, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/526,948

(22) Filed: Oct. 29, 2014

(65) Prior Publication Data

US 2015/0123169 A1 May 7, 2015

Related U.S. Application Data

(60) Provisional application No. 61/897,814, filed on Oct. 30, 2013, provisional application No. 61/897,802, filed on Oct. 30, 2013.

(51) Int. Cl.

| | |
|---|---|
| *C23C 14/30* | (2006.01) |
| *H01L 29/872* | (2006.01) |
| *H01L 29/47* | (2006.01) |
| *H01L 29/778* | (2006.01) |
| *C23C 14/06* | (2006.01) |
| *H01L 21/285* | (2006.01) |
| *H01L 29/06* | (2006.01) |

(52) U.S. Cl.
CPC ............. *C23C 14/30* (2013.01); *C23C 14/0641* (2013.01); *H01L 21/28581* (2013.01); *H01L 29/475* (2013.01); *H01L 29/7785* (2013.01); *H01L 29/872* (2013.01); *H01L 29/0619* (2013.01)

(58) Field of Classification Search
CPC ............ H01L 29/2003; H01L 29/7787; H01L 29/66462; H01L 29/7783; H01L 29/42316
See application file for complete search history.

(56) References Cited

U.S. PATENT DOCUMENTS

| | | | |
|---|---|---|---|
| 5,534,314 A | 7/1996 | Wadley et al. | |
| 7,829,448 B1 * | 11/2010 | Chang et al. | 438/576 |
| 2003/0161601 A1 | 8/2003 | Ouyang | |
| 2004/0238891 A1 | 12/2004 | Nakamura | |
| 2007/0275547 A1 * | 11/2007 | Cheng | 438/580 |
| 2008/0030824 A1 | 2/2008 | Griffith | |
| 2008/0102613 A1 * | 5/2008 | Elers | 438/584 |
| 2009/0115325 A1 | 5/2009 | Matsuzaki | |
| 2010/0052176 A1 * | 3/2010 | Kamada et al. | 257/763 |
| 2010/0200857 A1 * | 8/2010 | Shimada | H01L 29/7869 257/59 |
| 2012/0217591 A1 * | 8/2012 | Kamada | 257/410 |

* cited by examiner

*Primary Examiner* — Michelle Mandala
(74) *Attorney, Agent, or Firm* — Chang & Hale LLP

(57) ABSTRACT

Gate metallization structures and methods for semiconductor devices are disclosed, wherein a refractory metal barrier is implemented to provide performance improvements. Transistor devices are disclosed having a compound semiconductor substrate and an electron-beam evaporated gate structure including a layer of tantalum nitride (TaNx), a layer of titanium (Ti) and a layer of gold (Au).

19 Claims, 10 Drawing Sheets

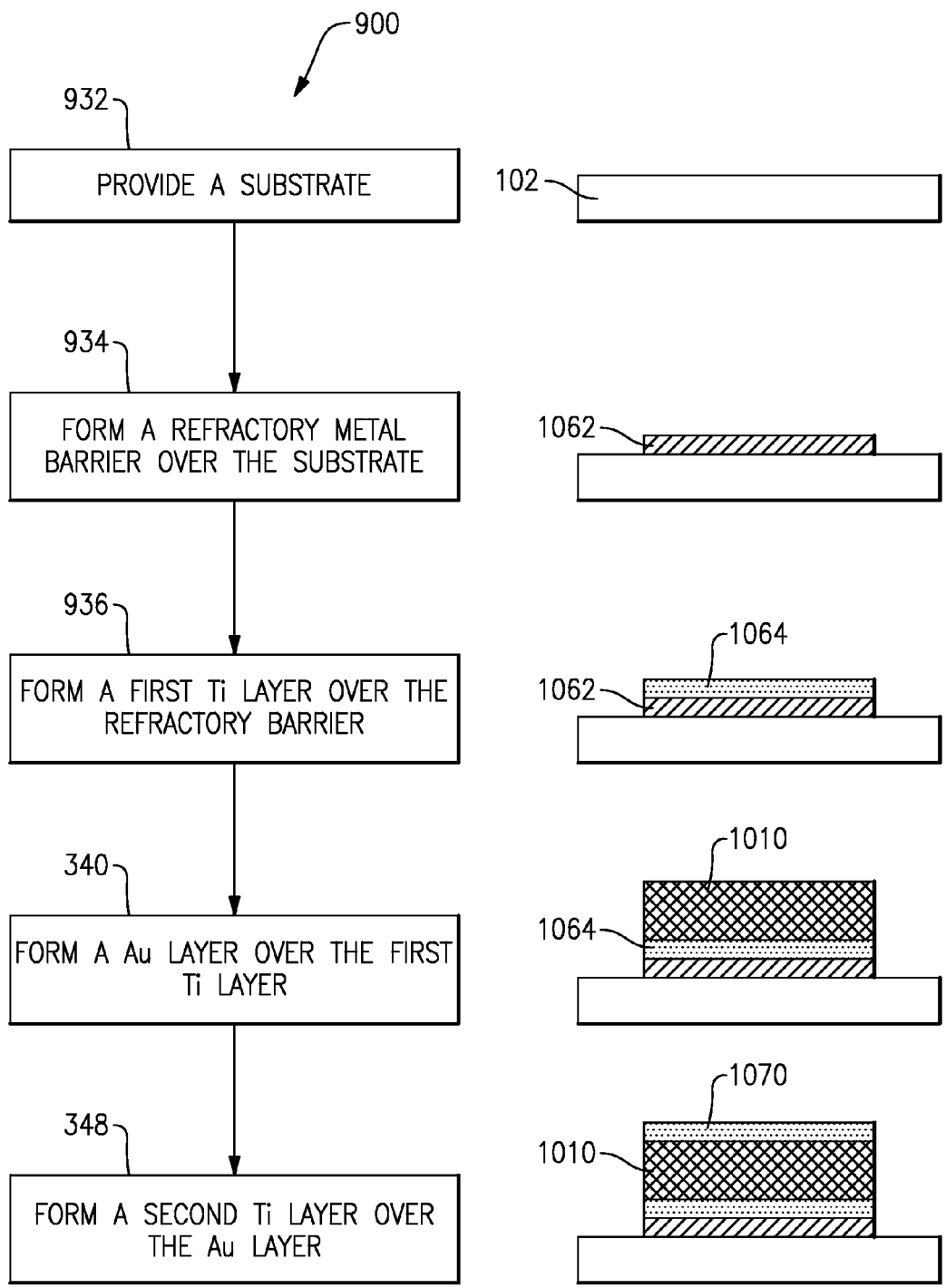

REFRACTORY METAL BARRIER IN SEMICONDUCTOR DEVICES

RELATED APPLICATION

This application claims priority to U.S. Provisional Application Nos. 61/897,814, filed on Oct. 30, 2013, entitled REFRACTORY METAL BARRIER IN SEMICONDUCTOR DEVICES, and 61/897,802, filed Oct. 30, 2013, entitled SYSTEMS, DEVICES AND METHODS RELATED TO REACTIVE EVAPORATION OF REFRACTORY MATERIALS, the disclosures of which are hereby incorporated by reference in their entirety.

BACKGROUND

1. Field

The present disclosure generally relates to metal gate structures for semiconductor devices.

2. Description of Related Art

Gate structures in certain semiconductor devices may include various metals in addition to, or as an alternative to, polysilicon. Although metal gate structures can enable higher clock speeds, lower power consumption, as well as providing possibly other benefits over certain alternative configurations, gate sinking and other issues can lead to performance degradation in certain embodiments.

SUMMARY

In some implementations, the present disclosure relates to a transistor device that includes a compound semiconductor substrate and an electron-beam evaporated gate structure including a layer of tantalum nitride (TaNx), a layer of titanium (Ti) and a layer of gold (Au). The value of the variable x associated with the TaN compound may be a value between 0.0 and 0.5, such as a value between 0.2 and 0.3. In certain embodiments, the TaNx compound is Ta2N.

In certain embodiments, a thickness of the TaNx layer is between approximately 100 and 300 angstroms. For example, the thickness of the TaNx layer may be approximately 150 angstroms. Furthermore, the gate structure may be a component of a field-effect transistor (FET). For example, the gate structure may be a component of a pseudomorphic high electron mobility transistor (pHEMT).

In certain embodiments, the layer of TaNx has a thickness between approximately 100 and 400 angstroms. The layer of TaNx may be configured to provide a diffusion barrier between the layer of Au and the compound semiconductor substrate. The gate structure may be configured to substantially prevent gate sinking into the compound semiconductor substrate when subjected to a processing temperature at or above approximately 300° C.

In certain embodiments, the gate structure includes an additional layer of TaNx and an additional layer of Ti. In certain embodiments, none of the layer of TaNx, the layer of Ti, or the layer of Au is formed using sputter deposition. Furthermore, the gate structure may or may not include platinum or palladium.

Certain embodiments disclosed herein provide a Schottky diode including a compound semiconductor substrate and a metal structure disposed on the compound semiconductor substrate including a first metal layer and a refractory metal layer disposed between the first metal layer and the compound semiconductor substrate, the refractory metal layer configured to inhibit diffusion of the first metal layer into the compound semiconductor substrate.

The refractory metal layer may include tantalum nitride (TaNx) and the first metal layer may include gold (Au). The Schottky diode may further include a second metal layer disposed between the first metal layer and the refractory metal layer. In addition, the Schottky diode may include a passivation layer disposed above the first metal layer. For example, the passivation layer may be titanium. In certain embodiments, the second metal layer is titanium.

In certain embodiments, the refractory metal layer is between approximately 100 and 300 angstroms in thickness. For example, the thickness of the refractory metal layer may be approximately 150 angstroms. The refractory metal layer may be formed using an evaporation process.

Certain embodiments disclosed herein provide a method of fabricating a semiconductor device, the method including providing a compound semiconductor substrate, evaporating a layer of tantalum nitride (TaNx) onto the compound semiconductor in a first processing step and using a first tool, evaporating a layer of titanium (Ti) onto the layer of TaNx in the first processing step and using the first tool, and evaporating a layer of gold (Au) onto the layer of Ti in the first processing step and using the first tool.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

FIGS. 9-10 show a process that can be implemented to fabricate the gate structure of FIG. 6.

DETAILED DESCRIPTION

The headings provided herein are for convenience only and do not necessarily affect the scope or meaning of the claimed invention.

Although certain preferred embodiments and examples are disclosed below, inventive subject matter extends beyond the specifically disclosed embodiments to other alternative embodiments and/or uses and to modifications and equivalents thereof. Thus, the scope of the claims that may arise herefrom is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

Overview

Various metallic elements and/or refractory alloys may be utilized in integrated circuits (ICs) for gate metallization in semiconductor devices. In particular, metal gate stacks may be useful in connection with gallium arsenide (GaAs) and/or other III-V compound semiconductors. For example, Schottky contacts may be used as gate metal for GaAs and indium phosphide (InP)-based substrates. Gates used for forming certain metal-semiconductor field effect transistors (MES-FETs), high-electron-mobility transistors (HEMTs), and other semiconductor devices may comprise metallic structures that form Schottky barrier contacts.

Materials such as gold (Au), aluminum (Al) and silver (Ag) can provide substantially good Schottky contacts to GaAs. However, heat treatment at approximately 300° C., for example, which may be required for subsequent processing, can result in inter-reaction, wherein gate metal diffuses into the semiconductor and/or gallium diffuses out of the semiconductor. Metal spiking, change of barrier height, and/or deviation from ideal rectifying behavior may result from such inter-reaction. Metals such as titanium (Ti) or tungsten (W) may advantageously provide relatively more inert interface properties. These metals can be used as part of a multilayer Schottky diode or transistor gate contact to provide at least a partial barrier between the primary gate metal and the semiconductor.

Figure 1:
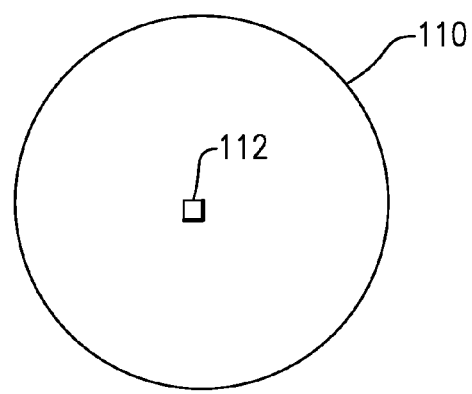
FIG. 1 schematically shows that in some implementations, a device having one or more features as described herein can be formed on a compound semiconductor substrate such as a wafer.

The present disclosure describes semiconductor gate metallization schemes that may provide reduced gate sinking and/or other metal-semiconductor inter-reaction when utilized in semiconductor devices. FIG. 1 schematically shows that in some implementations, a device 112 having one or more features as described herein can be formed on a compound semiconductor substrate such as a wafer 110. In certain embodiments, a device 112 formed on a compound semiconductor substrate (such as a wafer 110) can include one or more multilayer gate metal structures having one or more features as described herein. Various examples disclosed herein are described in the context of gallium arsenide (GaAs) compound semiconductor on which such gate structures can be implemented. However, it will be understood that such gate features can also be implemented on other compound semiconductors. For example, compound semiconductors such as InP, GaN, InGaP, and InGaAs can be utilized as a substrate on which gate structures having one or more features as described herein are formed.

It will also be understood that although various examples herein are described in the context of compound semiconductors, one or more features of the present disclosure can also be implemented on elemental semiconductors. For example, elemental semiconductors such as silicon and/or germanium can be utilized as a substrate on which gate structures having one or more features as described herein are formed.

Figure 2:
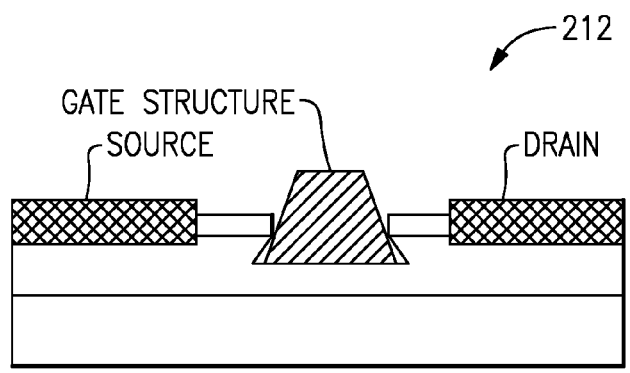
FIG. 2 shows an example of the device of FIG. 1, including a gate structure in accordance with one or more embodiments.

FIG. 2 shows an example of a device as shown in of FIG. 1, including a gate structure in accordance with one or more embodiments. FIG. 2 illustrates a transistor device 212 including a source region, a drain region, and a gate structure. The gate structure may allow for the passage of electrical signals from a semiconductor substrate to an external contact (not shown) through the gate structure. The gate structure may be a multilayer gate structure including one or more layers as described below with respect to FIGS. 4-6.

Figure 3:
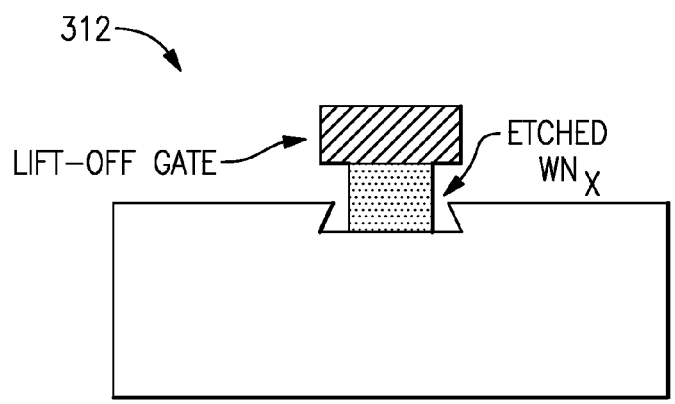
FIG. 3 shows another example of the device of FIG. 1, including a gate structure in accordance with one or more embodiments.

FIG. 3 shows another example of a device as shown in FIG. 1, including a gate structure in accordance with one or more embodiments. In certain embodiments, the device 312 is a pseudomorphic HEMT (pHEMT). The device 312 includes a gate structure that is fabricated using a lift-off approach. For example, the device 312 may be fabricated at least partially according to the following process: photoresist is applied to the wafer 110, and is patterned using a mask and photolithography. The exposed film is then developed and a metal film is evaporated onto the patterned wafer, before the remaining photoresist is removed to leave metallic contacts. In certain embodiments, gate structure is disposed on etched $WN_x$. Details of the gate structures of FIGS. 2 and 3 are described below.

Multilayer Metalization

Ti, W, and/or other elements can be utilized in gate metallization to provide at least a partial barrier between the primary gate metal of a gate structure and the semiconductor. However, in certain embodiments, Ti can form TiAs at temperatures above approximately 550° C. when in contact with GaAs. Furthermore, Ti may not prevent gold diffusion into GaAs over extended periods of time even at relatively lower temperatures. Certain digital circuit embodiments include $WSi_x$ or $WN_x$-type sputtered gates, where the sheet resistance of the gate layer can be high. However, for submicron gate layers used in analog or mixed signal circuits, it may be undesirable or impractical for the line sheet resistance to be too high. Certain embodiments include platinum (Pt)/Au Schottky gates. However, such schemes may present instabilities based on the intermixing of Pt with GaAs at approximately 300° C. or greater and at contact alloying temperatures, which may be required for making ohmic contacts (e.g., around 380° C. in rapid thermal processing). In view of the various potential shortcomings of these gate configurations, relatively more complex multilayer gate metallization (e.g., patterned by lift-off) may be necessary or desirable for certain applications.

Figure 4:
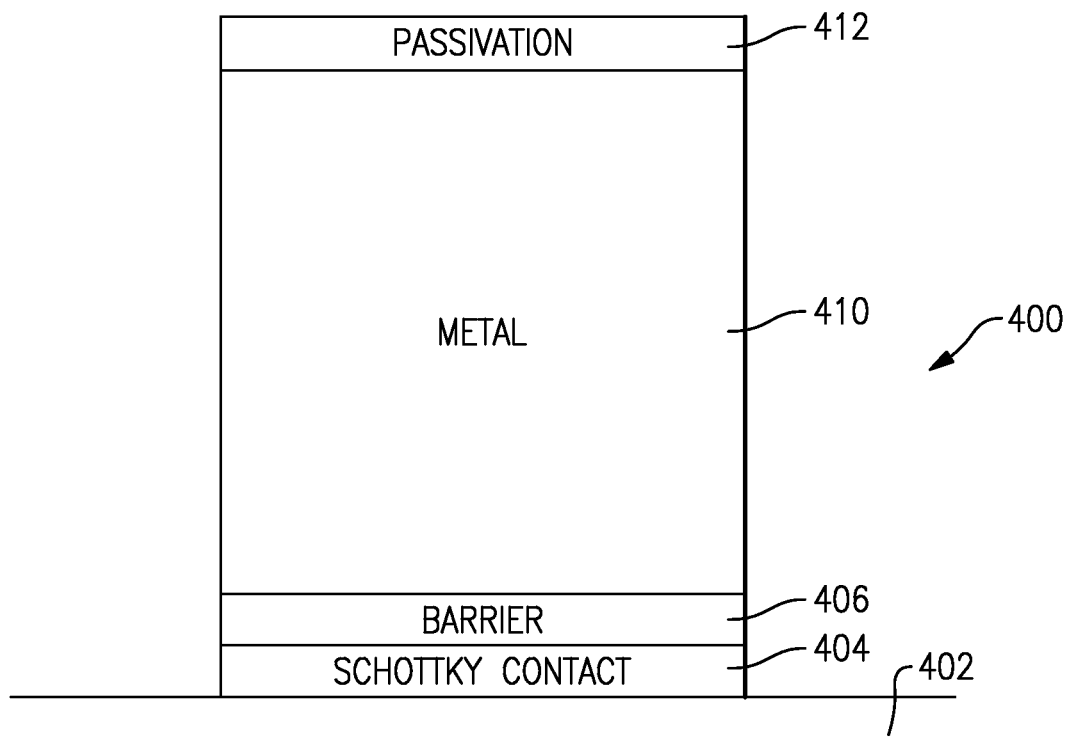
FIG. 4 shows an example of a metal stack structure.

FIG. 4 illustrates an example multilayer gate structure 400 in accordance with one or more embodiments. The gate structure 400 may be formed over a compound semiconductor substrate 402 and may include a Schottky metal contact element 404 configured to provide a rectifying contact between the gate metal 410 and the underlying semiconductor 402. Such rectifying contacts may be useful in certain semiconductor devices, such as Schottky diodes, or certain transistor devices. Whether a given metal-semiconductor junction provides an ohmic contact or Schottky barrier can depend on the Schottky barrier height, $\phi B$, of the junction. For a sufficiently large Schottky barrier height, where $\phi B$ is significantly higher than the thermal energy kT, the semiconductor can deplete near the metal and behave as a Schottky barrier. For lower Schottky barrier heights, the semiconductor is not depleted and instead forms an ohmic contact to the metal. Certain embodiments disclosed herein provide for a metal-semiconductor junction having a sufficiently large barrier height to provide a rectifying Schottky contact.

The gate structure 400 may include an additional barrier element 406, a primary gate metal 410, as well as a relatively inert passivation element 412 disposed above the primary metal 410 for protecting/preserving the gate structure. In certain embodiments, the contact layer 404, barrier layer 406, and primary metal layer 410 comprise titanium, platinum, and gold, respectively. Titanium may be desirable as a base layer that contacts the semiconductor because it generally forms a high-quality Schottky junction due to its work function and barrier height characteristics. Furthermore, titanium can adhere relatively well to the semiconductor, though the electrical conductivity is relatively poor (e.g., bulk resistivity of approximately $4 \times 10^{-5}$ $\Omega$/cm). Gold may be added to at least partially compensate for the relatively poor electrical conductivity of the titanium. However, as described above, gold can migrate and diffuse through titanium into the device under certain conditions, which can degrade device performance.

Multiple-layer metallization, such as Ti/Pt/Au or Ti/W/Au, may be adopted to at least partially obviate the effects of interaction between the gate metal and the semiconductor. In certain embodiments, sputtered Ti/W (e.g., approximately 10-20% Ti) may be used to separate a gold layer from the Schottky contact layer 404. In certain embodiments, a contact via placed on top of the Schottky contact may be required or desirable. Other types of barrier layers may be preferable or desirable in certain embodiments.

The barrier layer 406 may be sandwiched between the primary metal 410 and the contact layer 404 to at least partially prevent diffusion into the semiconductor 402. In certain embodiments, platinum may be desirable as a barrier metal, although other types of elements, such as palladium or other transition metal, may be used to alleviate cost or other issues associated with platinum. As further shown in FIG. 4, the gate structure 400 can also include a passivation layer 412 formed over the metal layer 410 comprising, for example, titanium.

Figure 5:
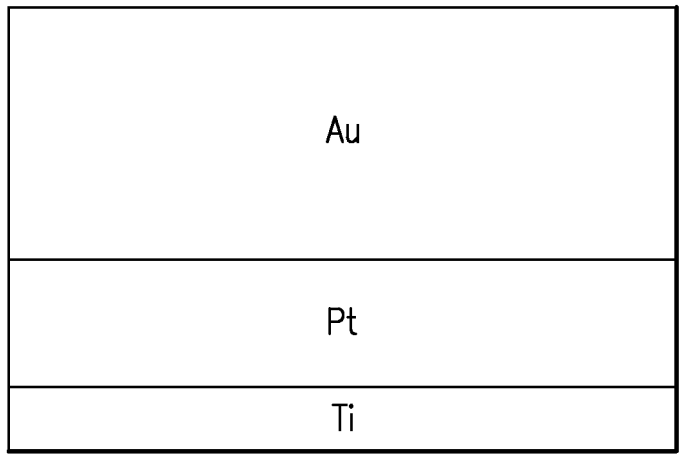
FIG. 5 schematically shows an example configuration of a metal stack structure.

FIG. 5 schematically shows an example configuration of a metal stack structure implementing a multilayer scheme. The embodiment of FIG. 5 provides a triple-layer, evaporated Ti/Pt/Au metallization scheme, which may be advantageous for Schottky and gate metallization. In certain embodiments, Pt may be replaced by Palladium (Pd), which, although possibly not providing as effective a barrier as Pt, may often be more cheaply obtainable.

Although Ti/Pt/Au metallization, as shown in FIG. 5, can provide various benefits when utilized in connection with III-V semiconductor devices, such a metallization scheme may be susceptible to some degree to gate metal sinking, as described above, which can place limits on the post-gate process thermal budget. Gate sinking, which involves the diffusion of gate metal into the top semiconductor under the gate metal and the channel, can result in changing of the threshold voltage and/or zero-bias drain current ($I_{DSS}$) during post gate formation processing and can ultimately prove fatal to a semiconductor device. As more layers of metal interconnect are added, the stability of the gate, and consequently the threshold voltage and transistor current, may be adversely affected. In addition to threshold control, reliability also may become questionable, and larger area devices may fail in practice due to metal sinking. Devices may degrade during packaging (involving more thermal processing during which diffusion can continue), as well as during the life of the device while in field.

In pHEMT circuits, the problems discussed above may cause loss of performance and/or gate shorting due to diffusion of gold into the channel. In more complex technologies like the BiFET and BiHEMT, ternary semiconductor compounds (like InGaAs) may be used for channels, and Schottky layers on top (for example, InGaP) may be added. However, gate diffusion and sinking may remain, and possibly worsen, depending upon the composition of the ternary semiconductor.

Refractory Metal Barriers

In certain embodiments, gate sinking may be at least partially alleviated through the use of a refractory metal for the Schottky contact. Refractory metals generally exhibit relatively high melting points (e.g., above approximately 2000° C.). Furthermore, refractory metals provide relatively inert chemical properties, as well as relatively high density. Such characteristics of refractor metals may provide reduced diffusion and/or gate sinking when disposed as part of a gate structure. In certain embodiments, tantalum (Ta) and/or tungsten (W), and/or compounds thereof, may be used in a gate stack to suppress diffusion and gate sinking. In other embodiments, niobium (Nb), molybdenum (Mo), or rhenium (Re) may be used.

Figure 6:
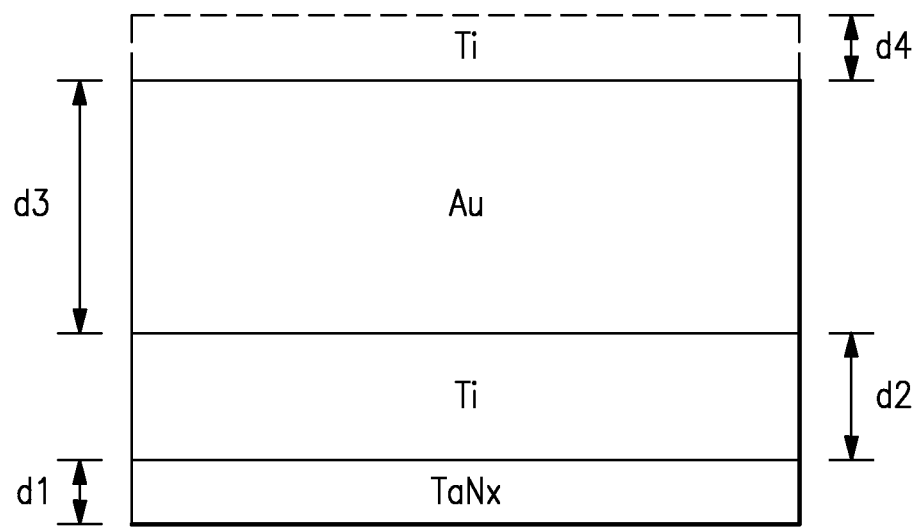
FIG. 6 schematically shows an example configuration of a metal stack structure including a refractory metal layer according to one or more embodiments.

FIG. 6 schematically shows an example configuration of a metal stack structure 600 including a refractory metal layer according to one or more embodiments. The gate structure 600 includes an Au gate with a bilayer Schottky metal and refractory barrier comprising Ti and $TaN_x$. For example a $TaN_x$ compound may be Ta2N, or other compound corresponding to a value of x between 0.0-0.5. In certain embodiments, the gate 600 comprises $WSi_x$, $WN_x$ or $WSi_xN_y$. Such gate materials may be used for IC processing for digital circuits where large current-carrying capability is not needed. The use of $TaN_x$ in combination with Ti may substantially limit interaction between the Au layer and the underlying semiconductor.

The thickness d3 of the gold layer may be between approximately 1000-10,000 Å, or up to 2 μm or thicker. In certain embodiments, the dimension d2, which represents the thickness of the intermediate Ti layer, may be approximately 100-800 Å. Further, the dimension d4, which represents the thickness of the optional top Ti layer, may be approximately 30-200 Å in thickness. With respect to the refractory barrier layer, the thickness d1 may be approximately 100-300 Å. In certain embodiments, if the thickness d1 of TaNx is too low, it will not provide a sufficient barrier. However, if the thickness is too high, the Schottky barrier properties of TaNx may take over, and the FET gate characteristics may shift. In certain embodiments, the thickness d1 is approximately 150 Å.

In certain embodiments, T-gate formation methods are utilized to clad refractory elements/compounds with gold for use in situations where larger current, lower resistance gates are needed. Although sputter deposition is a commonly used metal deposition technique, for radio frequency (RF) circuits, the use of sputtered $WN_x$-type materials may be limited.

In certain embodiments, Ni/Au or Pd/Au bilayers may also be used. However, such bilayers may suffer limitations caused by gate sinking when applied to large scale production.

The gate structure of FIG. 6, and/or gate structures embodying principles associated therewith and described herein, may provide one or more of the following benefits and/or characteristics: a barrier material that can be deposited with a high process latitude, wherein gas flow rates, background oxygen levels, and/or the like may not need to be controlled to high precision; the gate structure fabrication process may not require multiple steps and/or multiple tools; a material stack that can be deposited using ordinary e-beam production process; the layer structure may allow for the avoidance of sputter deposited layers, which may need to be etched off in processes incompatible with III-V compound semiconductor processing; a material stack that can used for gate sizes as small as traditional photolithography is capable of, and as large as needed or desired without a substantial risk of inter-diffusion, such as in large area devices where the probability of inter-diffusion may be increased; a gate layer structure that is not prone to process variations due to variable surface conditions; a metal layer structure that avoids use of expensive precious metals like platinum (Pt) or palladium (Pd); and a relatively simple, one photolithography process for multilayer gates, consisting of a highly conducting gold-like layer with a refractory layer underneath touching the semiconductor channel.

Refractory Metallization in FET/pHEMT Devices

Figure 7B:
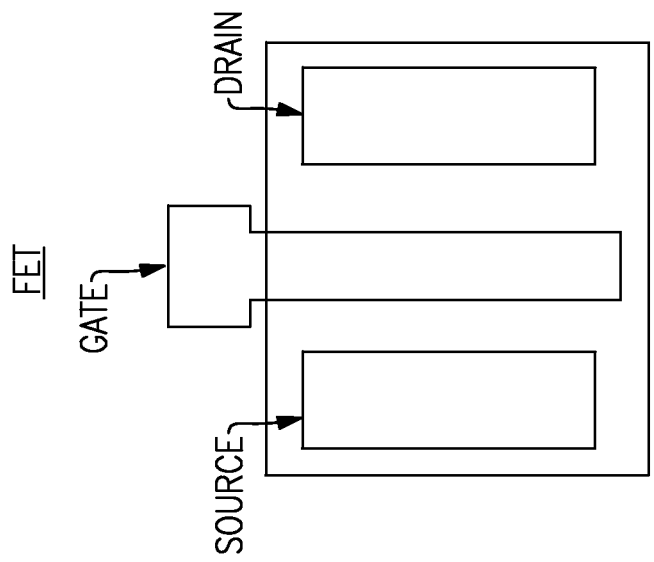
FIGS. 7A-7C show examples of transistor structures where one or more features of the present disclosure can be implemented.
Figure 7A:
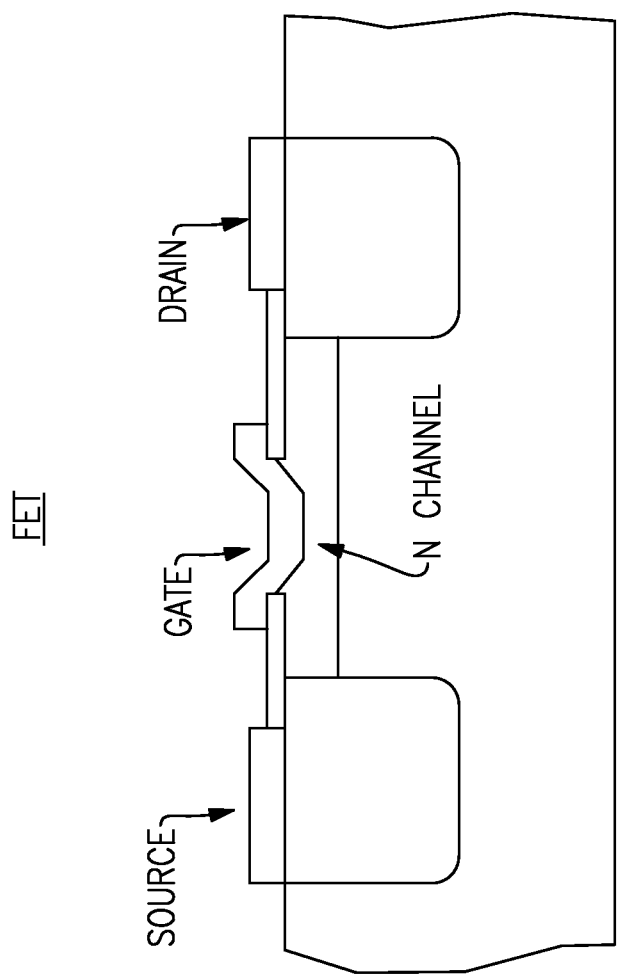

FIGS. 7A and 7B illustrate an example of a multilayer gate structure comprising refractory metallization embodied in a FET device. For example, the device of FIGS. 7A and 7B may be a MOSFET, or the like. While FIG. 7A illustrates a cross-sectional view, FIG. 7B provides a top view, as shown.

Figure 7C:
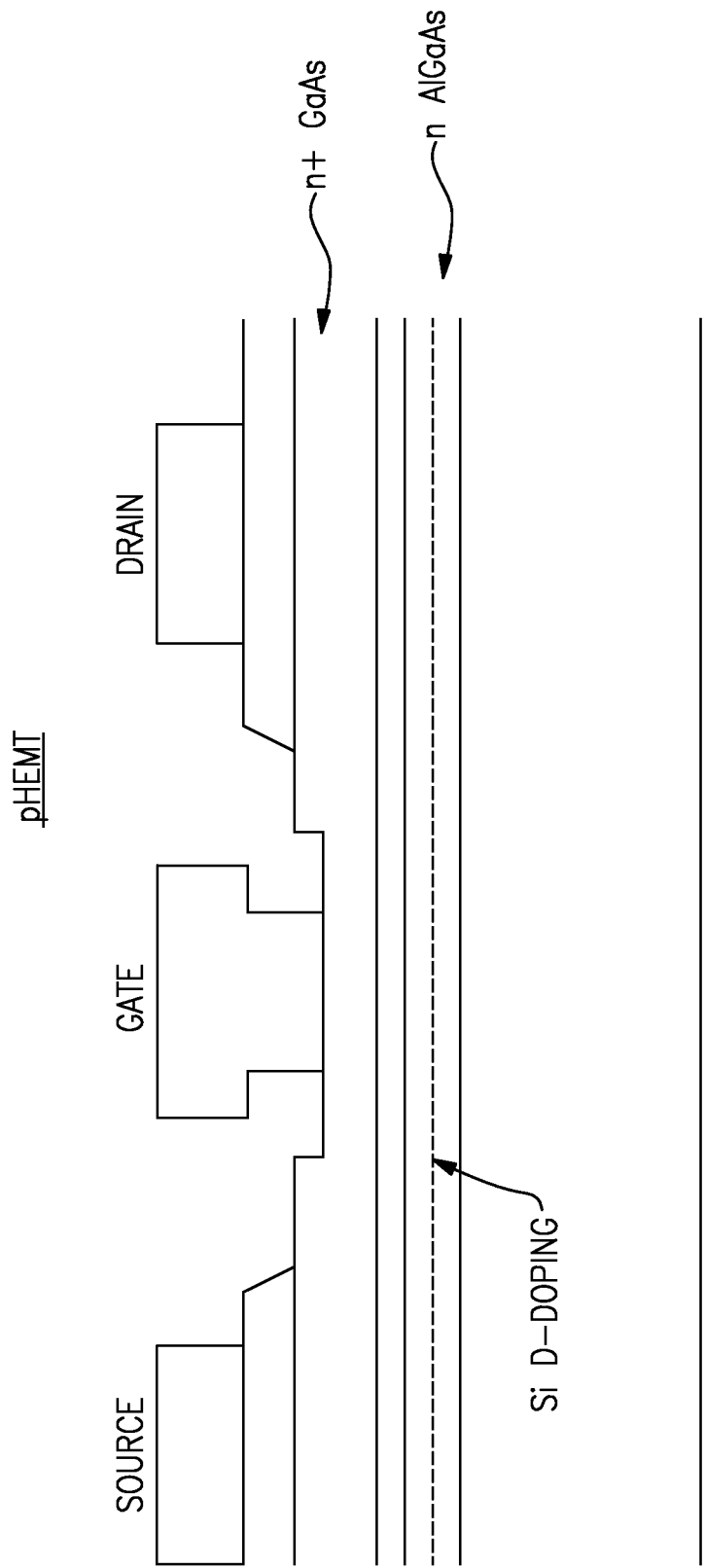

An example of a multilayer gate structure comprising refractory metallization can be further described in the context of an example pHEMT structure 150 shown in FIG. 7C. The pHEMT structure of FIG. 7C can be formed on a semi-insulating GaAs substrate. A GaAs buffer layer may be formed over the substrate. A GaAs—AlGaAs superlattice region may be formed over the buffer layer. The superlattice region can include a plurality of GaAs and AlGaAs layers. A first AlGaAs barrier layer may be formed over the superlattice region. A portion of the AlGaAs barrier layer is shown to be doped with silicon (dashed line). An InGaAs channel layer may be formed over the first AlGaAs barrier layer. In certain embodiments, a second AlGaAs barrier layer is formed over the InGaAs channel layer, which may also be doped with silicon.

Additional layers to provide the source, drain, and gate functionalities can be formed. For example, an n+ GaAs layer is shown to be formed below the gate structure. In certain embodiments, a TaN/Au gate may be used in a T-gate for the pHEMT, as shown. Gates of HEMT devices are often Schottky contacts. Therefore, rectifying gate structures comprising built-in refractory barriers as described herein may advantageously be utilized in pHEMT devices, or other HEMT or transistor devices. The gate of the pHEMT may comprise an Au gate with a bilayer Schottky metal and refractory barrier comprising Ti and $TaN_x$. Furthermore, the gate may have any suitable refractory barrier/gate structure as described herein.

Refractory Metallization in Schottky Diodes

Figure 8:
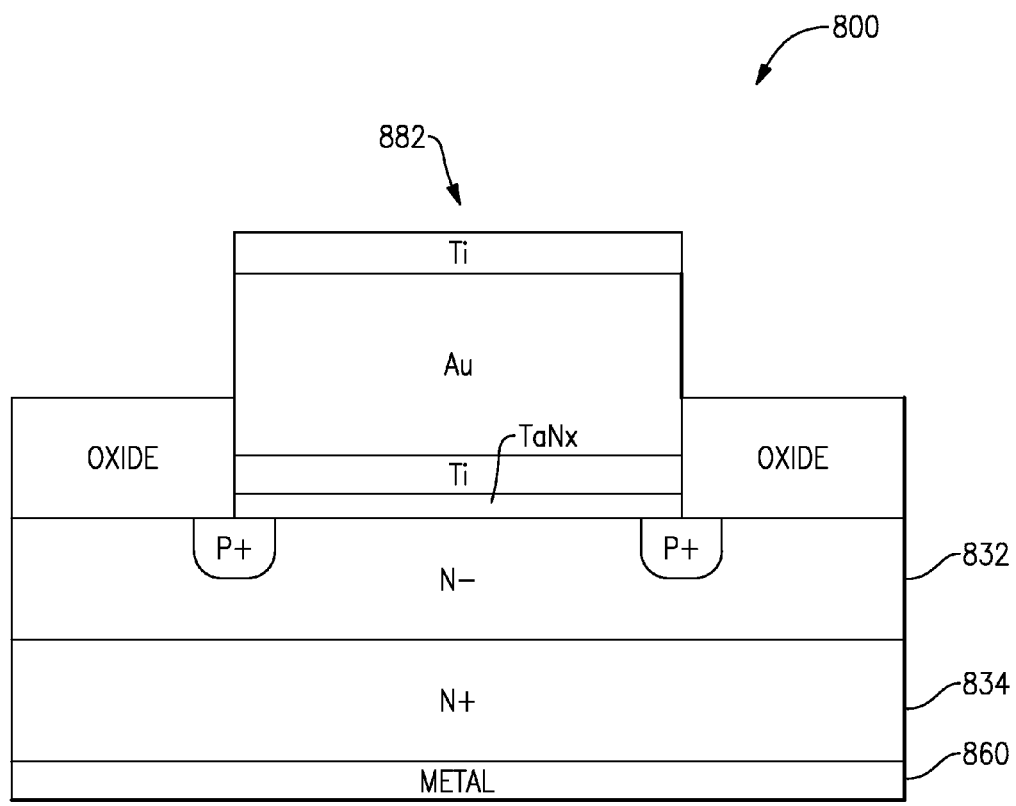
FIG. 8 shows an example of a Schottky diode structure where one or more features of the present disclosure can be implemented.

FIG. 8 shows an example of a Schottky diode structure 800 where one or more features of the present disclosure can be implemented. The diode 800 may be formed on an N+ doped semiconductor substrate 834, which is in ohmic contact with a metal layer 860. The metal layer 860 may provide electrical contact for a cathode of the diode 800. In certain embodiments, a lightly doped epitaxial n-type blocking layer 832 is formed above the substrate. The doping and thickness of the epitaxial layer 832 may be selected to achieve a desired blocking voltage.

The diode 800 includes a metal structure 882 through which electrical communication with the anode is achieved. In certain embodiments, the metal structure 882 may comprise a multilayer configuration, as described in association with one or more embodiments herein. The structure 882 may include a refractory metal Schottky barrier comprising, for example, $TaN_x$ and/or Ti, as well as a Au gate layer. The structure 882 may further include a passivation layer on top of the gold layer, such as a layer of Ti or the like.

The diode 800 may include one or more isolation trenches or regions 818, such as in the form of a ring at least partially surrounding the Schottky junction. Such isolation region 818 may be implanted prior to deposition of the Schottky metal. The isolation region 818 may help field crowding at the periphery of the metal in the blocking state, which may reduce the blocking voltage.

Schottky diodes utilizing refractory metallization may be incorporated in various RF components. For example, Schottky diodes constructed as disclosed herein may be used as components for frequency mixers, RF power detector circuits, or other devices or components.

Processing

In certain embodiments, TaN barriers, or other refractory metal barriers, may be deposited using a sputter deposition process. However, sputter deposition can cause damage to the semiconductor under the metal under certain conditions, which may need to be annealed out. In certain embodiments, low-resistivity gates are desirable, wherein etching may be necessary to achieve the desired resistivity characteristics due to the thickness of the sputtered metal. However, etch processes may not be compatible with certain III-V semiconductor processes, such as certain heterojunction bipolar transistor (HBT), enhanced bipolar field effect transistor (BiFET) and integrated HBT/pHEMT (BiHEMT) processes because of the presence of silicon nitride on the wafers, which can become etched off, thereby exposing sensitive devices/components to ion damage and requiring additional processing to deposit new passivation. In addition, lift-off processes may also be incompatible with thick sputtered metal films. If a layer thick enough to provide effective barrier characteristics is used as a lower gate layer (e.g., contacting the semiconductor channel or the top Schottky layer), then it may be necessary for a highly-conductive layer, such as gold or the like, to be added on top. Therefore, multilayer gate and processing methods designed to achieve such structure, partially patterned by sputter-lift-off and partially by lift-off, may be desirable, though such methods may be substantially complicated and require more steps.

Surfaces of III-V binary or ternary compounds can be substantially complex, which can make consistent surface reproduction difficult in production conditions. Furthermore, the surfaces can change upon exposure to air, such as between the cleaning step and the actual deposition of the metal. Therefore, the nature of the semiconductor surface in large volume production may vary substantially. Even when precautions are taken, the state of surface oxidation may change and the intermixing of the gate metal and the semiconductor can vary as a result. Under these conditions, adhesion metals, such as Ti, Pt, and Pd, may diffuse to varying degrees. Certain embodiments disclosed herein advantageously provide a refractory built-in barrier, such as $TaN_x$, (x being a value between 0.0-0.5, such as between 0.2-0.3), evaporated by electron beam evaporation, deposited in the same evaporation step as one or more other layers of a gate structure.

Although certain embodiments are described herein in the context of GaAs channel layers, other types of semiconductor substrates may be used depending on preference or other factors. For example, in epitaxially-grown structures, particularly with respect to hetero-structures, ternary compounds like AlGaAs may be used as a top layer. Forming a top layer under the Schottky metal that is less prone to process issues and intermixing may be desirable. For example, with respect to pHEMT and other epi-structure devices, AlGaAs, InGaP and/or other compounds, such as In, AlP etc., may be used.

Certain embodiments disclosed herein provide for the use of oxides in fabricating III-V MOSFETs. For such purpose, it may be desirable to utilize a semiconductor material that forms a good clean oxide, similar to silicon, and also allows for formation of a metal gate thereon that is stable. Such applications may utilize, for example, Ti/Pt/Au gate metallization, as described herein. Alternatively, Ni/Au or Pd/Au structures may be utilized. Instability caused by sinking that may be experienced using such structures may be used to adjust threshold voltages by submitting the wafers to thermal cycles to control the threshold voltage. In certain embodiments, Molybdenum (Mo) may be used to provide increased stability. Furthermore, Mo/Au gates may provide relatively high-speed. However, evaporating Mo in production can be difficult, as the melting point is approximately 2890° C. In addition, molybdenum is used as a common crucible liner in e-beam evaporation systems.

TaNx can provide certain advantages over other refractory materials, such as Mo and W. For example, Mo generally does not form dry etchable compound like TaNx. Furthermore, the film stress cannot be reduced by the addition of other element or compound formation, so films can be subject to peeling. Tungsten can form a nitride that is etchable. However, evaporation of tungsten may not be practical, even with electron beam methods. Various systems and method for evaporating metals in accordance with one or more embodiments disclosed herein are described in greater detail in U.S. application Ser. No. 14/527,577, entitled "SYSTEMS, DEVICES AND METHODS RELATED TO REACTIVE EVAPORATION OF REFRACTORY MATERIALS" and filed on even date herewith, as well as U.S. Pat. No. 8,022,448 entitled "APPARATUS AND METHODS FOR EVAPORATION INCLUDING TEST WAFER HOLDER" and filed on Oct. 5, 2010, both of which are incorporated herein by reference in their entirety.

Example Method for Fabrication of Example Metal Stack

Certain embodiments disclosed herein provide for evaporation of TaNx by electron beam evaporation, which may present challenges in view of the very high melting point of tantalum. With an evaporated TaNx film, a standard lift-off process may be used to enable better control of structure line width.

FIG. 9 shows an embodiment of a process 900 that can be implemented to fabricate the example metal stack of FIGS. 6-8. FIG. 10 shows various stages of fabrication of the metal stack. At block 932, a compound semiconductor substrate (1002) such as GaAs may be provided. The process 900 further includes forming a refractory barrier over the substrate at block 934. The refractory barrier may comprise TaN, or other compound, and may be deposited using an electron beam evaporation process, as described herein.

At block 936, a first Ti layer (1064) can be formed over the refractory metal barrier (1062). In some implementations, the first Ti layer (1064) can be formed by an electron-beam evaporation deposition process.

At block 940, a Au layer (1010) can be formed over the first Ti layer (1064). In some implementations, the Au layer (1010) can be formed by an electron-beam evaporation deposition process. A tungsten (W) or molybdenum (Mo) crucible can be used for the evaporation of Au. Use of such a liner can provide advantageous features such as reducing thermal contact to the hearth (which is water cooled in some situations), thereby allowing a higher deposition rate for a given beam power. Other deposition methods and configurations can also be utilized.

At block 948, a second Ti layer (1070) can be formed over the Au layer (1010). In some implementations, the second Ti layer (176) can be formed by an electron-beam evaporation deposition process similar to the example associated with the first Ti layer (1064). Other deposition methods and configurations can also be utilized.

Although evaporating tantalum can present certain challenges, electron beam evaporated TaNx film can provide certain advantages over sputtered TaN film. Thin layers of $Ta_xN_{1-x}$, denoted herein in certain contexts as TaNx, may be used in electronic components built from III-V semiconductors, among other devices. Such layers may be deposited by sputter deposition, for ease of control of composition and TCR for certain devices where uniformity and reproducibility are significant considerations. Dry etching of TaN films may be relatively difficult and may involve relatively harsh chemistry. In addition, it may be relatively difficult to achieve high selectivity with chlorine chemistry when the film is deposited over, for example, silicon nitride. In III-V semiconductor circuits, such as circuits formed on GaAs substrates, lift-off patterning process may be preferred. Patterning over silicon nitride may be performed by dielectric assisted lift-off (DAL) process, where the nitride is etched off and the TaNx film sits on GaAs. Such a process may be associated with certain drawbacks. Alternatively, evaporation methodology may allow for the use of standard lift-off technique to define the relevant device or component, thereby eliminating the need for DAL. In addition, the TaN can be placed on SiNx, which may improve active device leakage current. Furthermore, with the ability to form the TaNx film directly on silicon nitride, the TCR of the TaN may be considerably more stable and the device may be less susceptible to leakage through the GaAs substrate. In certain embodiments, a large bias is applied to the mask, which may place a limit on device-to-device spacing. Certain embodiments disclosed herein provide an alternative method for depositing TaNx film by means of electron beam evaporation with nitrogen incorporation in the process chamber. By optimizing the input parameters, a stable TaNx film can be achieved matching the desired properties of the sputtered TaN film.

E-beam evaporators may be used for TaNx deposition with minimal additional hardware. N2 may be plumbed into the process chamber using a feed-through, tubing and the gas distribution controlled via a MFC and a pressure gauge. Tantalum, which is a refractory metal with a very high melting point, can be relatively challenging to evaporate. High power may be required to evaporate tantalum metal. However, with proper melt setup and maintaining a low deposition rate, the process may be established with reasonable power control. The process is manufacturable for film thickness providing a sheet resistance of approximately 50 ohms/sq., which may require only a few hundred angstroms.

N2 may be incorporated into the tantalum deposition throughout the entire process layer. In certain embodiments, the properties of the TaNx film may be controlled by varying the nitrogen content of the film. Tantalum may be readily reactive to the nitrogen resulting in a fairly wide range of N2 flow with stable and repeatable film resistance and stress. The optimum deposition conditions may ultimately be determined based on finding a N2 gas flow in a range that is not sensitive to small changes and achieving low film stress. Within this range, the composition of the film can be chosen to achieve a resulting film that meets the properties for the film.

Figure 11:
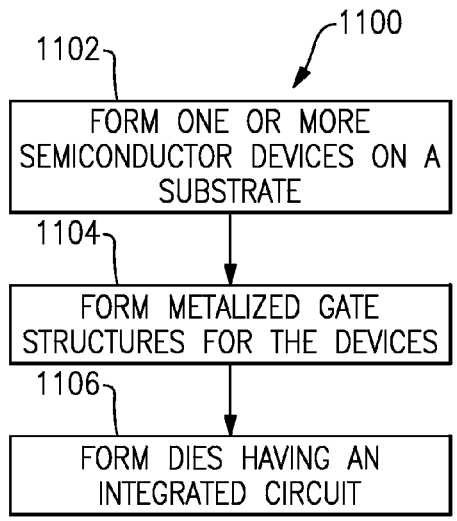
FIG. 11 shows a process that can be implemented to fabricate a die having one or more metalized structures as described herein.

In some embodiments, metalized structures having one or more features as described herein can be implemented in a compound semiconductor wafer, which in turn can yield a plurality of dies. Each of such dies can include an integrated circuit configured to perform a number of functions. FIG. 11 shows a process 1100 that can be implemented to fabricate a die (1210 in FIG. 12A) having one or more metalized structures as described herein. At block 1102, one or more semiconductor devices can be formed on a compound semiconductor substrate such as GaAs. At block 1104, one or more metalized gate structures can be formed for such devices. At block 1106, a die having an integrated circuit that includes the metalized gate structures can be formed.

Figure 12B:
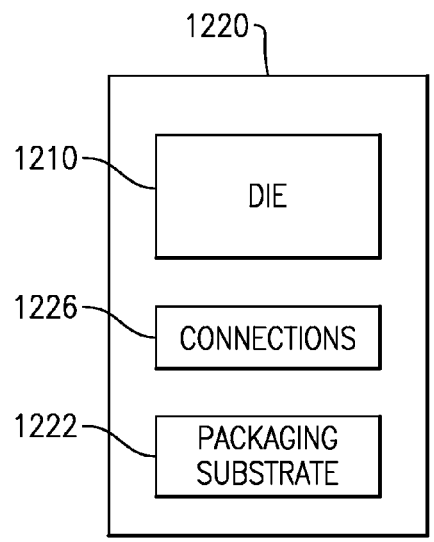
FIGS. 12A and 12B schematically depict a module having one or more dies.
Figure 12A:
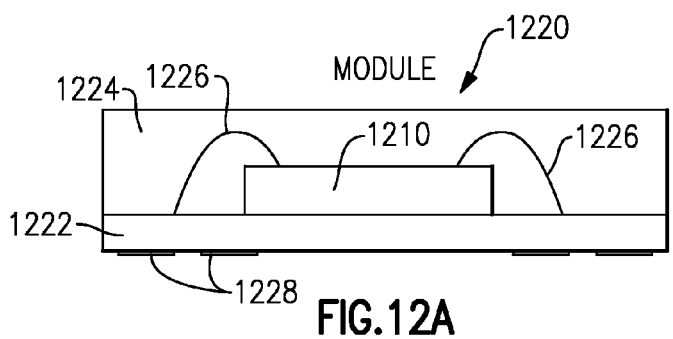

In some embodiments, a die having one or more metalized gate structures as described herein can be implemented in a module. FIG. 12A shows an example of such a module 1220, and FIG. 12B shows a block diagram representation of the same. The module 1220 can include a die 1210, which may be mounted on a packaging substrate 1222, and can be protected by an overmold structure. Electrical connections to and from the die 1210 can be facilitated by connections 1226 such as wirebonds. Such wirebonds can be interconnected to connection pads 1228 formed on the module so as to facilitate connectivity to other modules and/or external components.

In some embodiments, the module 1220 can also include one or more surface-mount devices (SMD) mounted on the packaging substrate 1222 and configured to facilitate and/or complement the functionality of the integrated circuits in the die 1210. In some embodiments, the module 1220 can also include one or more packaging structures to, for example, provide protection and facilitate easier handling of the module 1220. Such a packaging structure can include an overmold formed over the packaging substrate 1222 and dimensioned to substantially encapsulate the various circuits and components thereon. It will be understood that although the module 1220 is described in the context of wirebond-based electrical connections, one or more features of the present disclosure can also be implemented in other packaging configurations, including flip-chip configurations.

Figure 13:
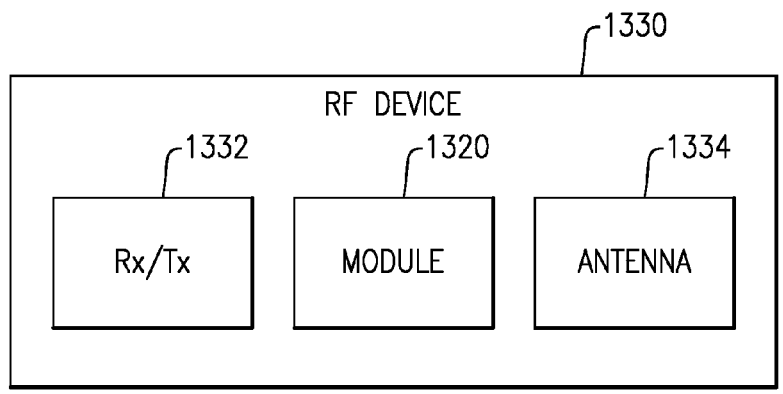
FIG. 13 schematically depicts a radio-frequency (RF) device that includes one or more dies and/or one or more modules having one or more features as described herein.

In some embodiments, a module or a die having one or more metal gate structures as described herein can be implemented in a radio-frequency (RF) device. FIG. 13 shows an example of such an RF device 1330. The RF device 1330 can include a module 1320 similar to the module described in reference to FIGS. 12A and 12B. In some implementations, such a module can facilitate operation of a transmit/receive circuit 1332 and an antenna 1334. In some embodiments, the module 1320 can be configured to provide, for example, amplification of RF signals, switching of RF signals, and/or other RF related functions.

In some implementations, a device and/or a circuit having one or more features described herein can be included in a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 14:
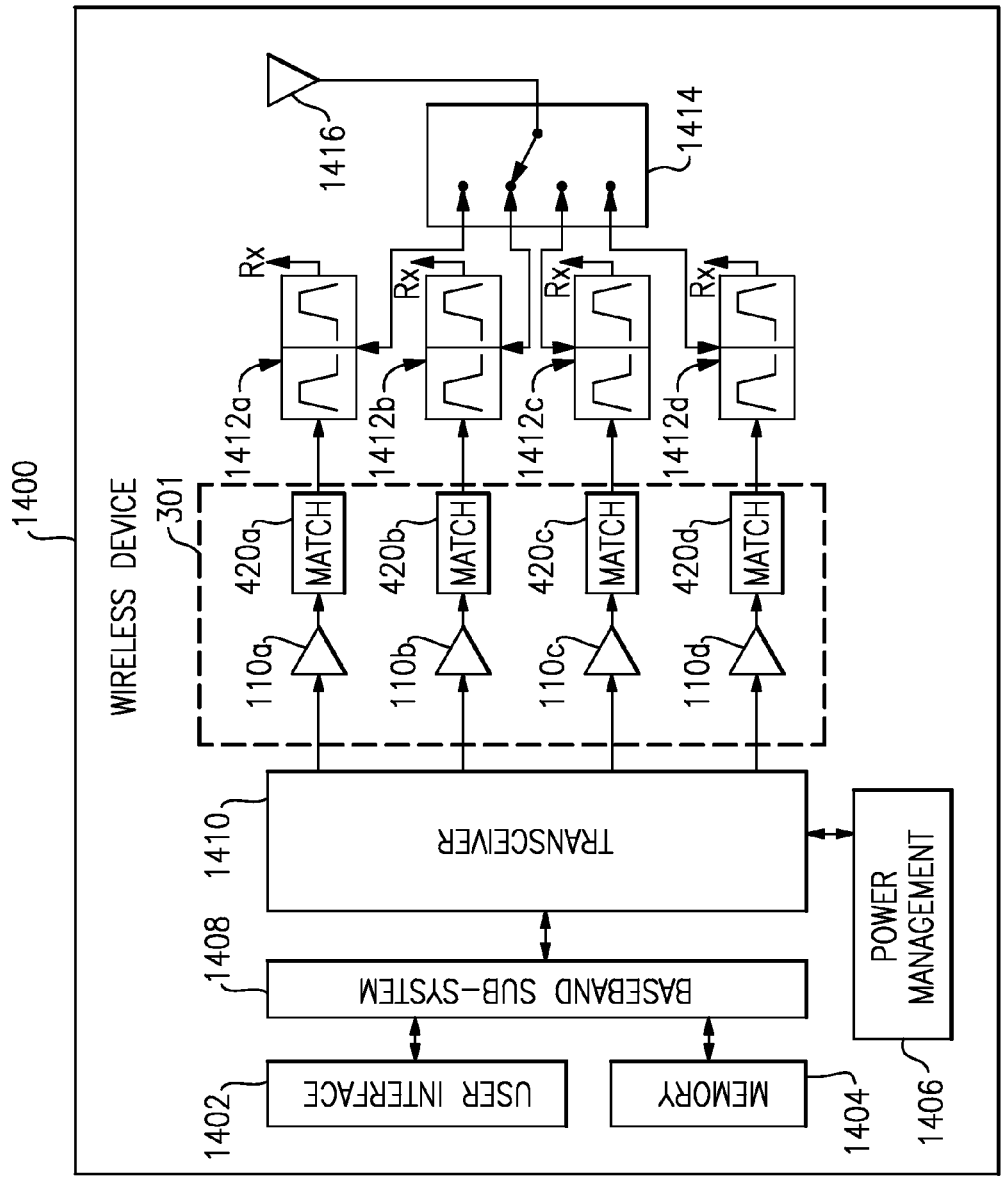
FIG. 14 is a block diagram showing an embodiment of a wireless device in accordance with one or more features of the present disclosure.

FIG. 14 schematically depicts an example wireless device 1400 having one or more advantageous features described herein. One or more PAs 110 are shown, which can facilitate, for example, multi-band operation of the wireless device 1400. In embodiments where the PAs and their matching circuits are packaged into a module, such a module can be represented by a dashed box 301.

The PAs 110 can receive their respective RF signals from a transceiver 1410 that can be configured and operated in known manners to generate RF signals to be amplified and transmitted, and to process received signals. The transceiver 1410 is shown to interact with a baseband sub-system 1408 that is configured to provide conversion between data and/or voice signals suitable for a user and RF signals suitable for the transceiver 1410. The transceiver 1410 is also shown to be connected to a power management component 1406 that is configured to manage power for the operation of the wireless device. Such power management can also control operations of the baseband sub-system 1408 and the module 301.

The baseband sub-system 1408 is shown to be connected to a user interface 1402 to facilitate various input and output of voice and/or data provided to and received from the user. The baseband sub-system 1408 can also be connected to a memory 1404 that is configured to store data and/or instructions to facilitate the operation of the wireless device, and/or to provide storage of information for the user.

In the example wireless device 1400, outputs of the PAs 110 are shown to be matched (via match circuits 420) and routed to an antenna 1416 via their respective duplexers 1412*a*-1412*d* and a band-selection switch 1414. The band-selection switch 1414 can include, for example, a single-pole-multiple-throw (e.g., SP4T) switch to allow selection of an operating band (e.g., Band 2). In some embodiments, each duplexer 1412 can allow transmit and receive operations to be performed simultaneously using a common antenna (e.g., 1416). In FIG. 14, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS. The components described above in connection with FIG. 14 and wireless device 1400 are provided as examples, and are non-limiting. Moreover, the various illustrated components may be combined into fewer components, or separated into additional components. For example, baseband sub-system 1408 can be at least partially combined with the transceiver 1410. As another example, the transceiver 1410 can be split into separate receiver and transmitter portions.

The wireless device 1400 may include one or more pseudo-morphic high electron mobility transistors (pHEMT), metal semiconductor field effect transistors (MESFET), heterojunction bipolar transistors (HBT), bipolar FETs (BiFET), bipolar HEMTs (BiHEMT), and/or surface acoustic wave (SAW) devices (e.g., SAW filter or resonator) that can include or be connected to gate structures having one or more features as described herein. It will be understood that other semiconductor devices utilized in wireless devices can also benefit from such gate structures. It will also be understood that semiconductor devices associated with other types of electronic devices can also benefit from gate structures having one or more features as described herein.

Figure 15B:
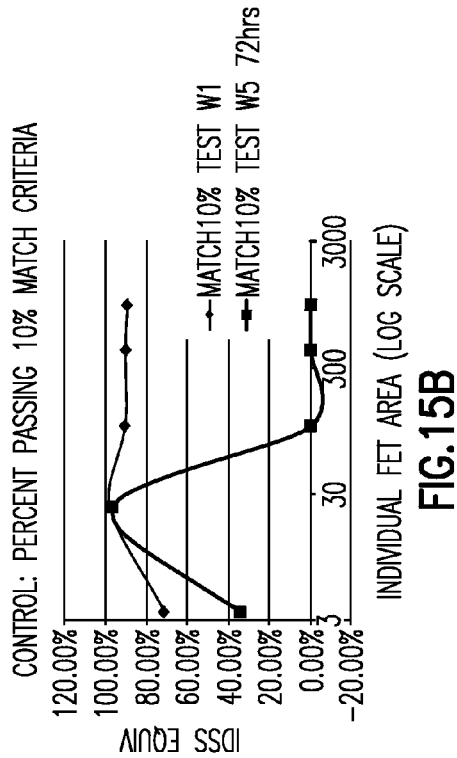
FIGS. 15A-15D are graphs illustrating potential performance achievable through implementation of refractory barrier gate stacks according to one or more embodiments disclosed herein.
Figure 15D:
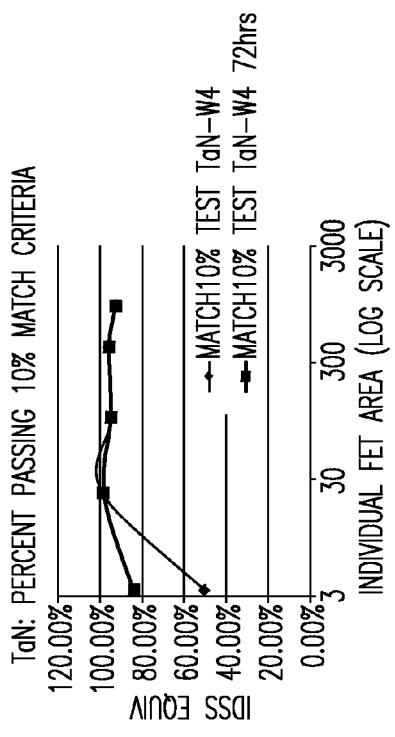
Figure 15A:
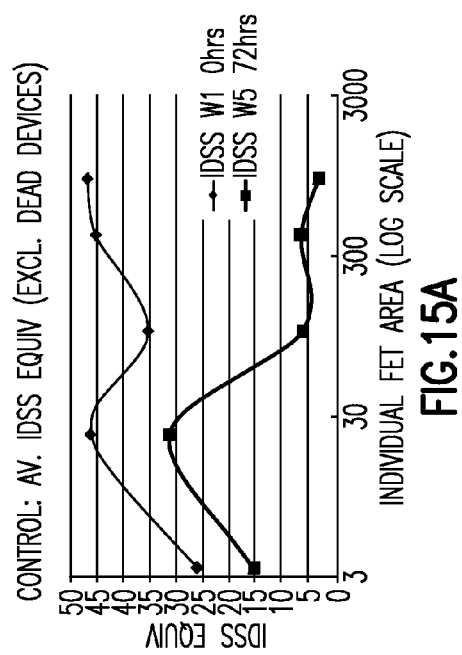
Figure 15C:
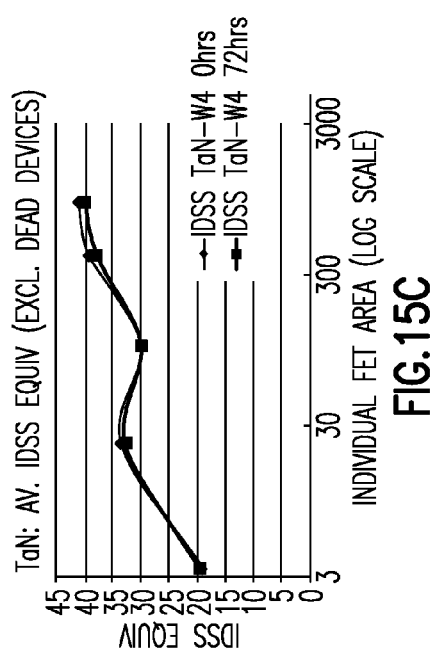

FIGS. 15A-D provide graphs illustrating potential performance improvements with respect to Idss that may be achievable through implementation of refractory barrier gate stacks in connection with certain embodiments disclosed herein. In particular, FIGS. 15A and B show Idss and device passage rates over time for devices not utilizing TaN barrier layers. FIGS. 15C and D show possible improved performance for TaN devices. The graphs of FIGS. 15A-D illustrate the effect of temperature on FET matching versus gate size according to certain embodiments.

Other Embodiments

Depending on the embodiment, certain acts, events, or functions of any of the processes or algorithms described herein can be performed in a different sequence, may be added, merged, or left out altogether. Thus, in certain embodiments, not all described acts or events are necessary for the practice of the processes. Moreover, in certain embodiments, acts or events may be performed concurrently, e.g., through multi-threaded processing, interrupt processing, or via multiple processors or processor cores, rather than sequentially.

Conditional language used herein, such as, among others, "can," "could," "might," "may," "e.g.," and the like, unless specifically stated otherwise, or otherwise understood within the context as used, is intended in its ordinary sense and is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous, are used in their ordinary sense, and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. Conjunctive language such as the phrase "at least one of X, Y and Z," unless specifically stated otherwise, is understood with the context as used in general to convey that an item, term, element, etc. may be either X, Y or Z. Thus, such conjunctive language is not generally intended to imply that certain embodiments require at least one of X, at least one of Y and at least one of Z to each be present.

It should be appreciated that in the above description of embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that any claim require more features than are expressly recited in that claim. Moreover, any components, features, or steps illustrated and/or described in a particular embodiment herein can be applied to or used with any other embodiment(s). Further, no component, feature, step, or group of components, features, or steps are necessary or indispensable for each embodiment. Thus, it is intended that the scope of the inventions herein disclosed and claimed below should not be limited by the particular embodiments described above, but should be determined only by a fair reading of the claims that follow.

What is claimed is:

1. A transistor device comprising:
a compound semiconductor substrate; and
a gate structure including a silicon nitride ($SiN_x$) layer deposited on the compound semiconductor substrate, an electron beam evaporated tantalum nitride ($TaN_x$) layer having a thickness less than 300 angstroms and deposited on the $SiN_x$ layer, a first electron beam evaporated titanium (Ti) layer deposited on the $TaN_x$ layer, an electron beam evaporated gold (Au) layer deposited on the first Ti layer, and a second electron beam evaporated Ti layer deposited on the Au layer.

2. The transistor device of claim 1 wherein x is a value between 0.0 and 0.5.

3. The transistor device of claim 2 wherein x is a value between 0.2 and 0.3.

4. The transistor device of claim 1 wherein $TaN_x$ is Ta2N.

5. The transistor device of claim 1 wherein a thickness of the TaNx layer is between 100 and 300 angstroms.

6. The transistor device of claim 5 wherein the thickness of the TaNx layer is approximately 150 angstroms.

7. The transistor device of claim 5 wherein the $TaN_x$ layer is configured to provide a diffusion barrier between the Au layer and the compound semiconductor substrate.

8. The transistor device of claim 1 wherein the gate structure is a component of a field-effect transistor (FET).

9. The transistor device of claim 1 wherein the gate structure is a component of a pseudomorphic high electron mobility transistor (pHEMT).

10. The transistor device of claim 1 wherein the gate structure is configured to substantially prevent gate sinking into the compound semiconductor substrate when subjected to a processing temperature at or above 300° C.

11. The transistor device of claim 1 wherein the gate structure includes an additional layer of $TaN_x$.

12. The transistor device of claim 1 wherein none of the $TaN_x$ layer, the first Ti layer, the second Ti layer or the Au layer is formed using sputter deposition.

13. A Schottky diode comprising:
a compound semiconductor substrate; and
a metal structure disposed on the compound semiconductor substrate, the metal structure including an electron beam evaporated refractory metal layer having a thickness less than 300 angstroms disposed on the semiconductor substrate, a first electron beam evaporated titanium (Ti) layer disposed on the refractory metal layer, an electron beam evaporated gold (Au) layer formed on the first Ti layer, and a second electron beam evaporated Ti layer formed on the Au layer, the refractory metal layer configured to inhibit diffusion of the Au layer into the compound semiconductor substrate.

14. The Schottky diode of claim 13 wherein the refractory metal layer includes tantalum nitride ($TaN_x$).

15. The Schottky diode of claim 13 wherein the second Ti layer provides a passivation layer for the metal structure.

16. The Schottky diode of claim 13 wherein a thickness of the refractory metal layer is between 100 and 300 angstroms.

17. The Schottky diode of claim 16 wherein the thickness of the refractory metal layer is approximately 150 angstroms.

18. The Schottky diode of claim 13 wherein the refractory metal layer is formed using an evaporation process.

19. A method of fabricating a semiconductor device, the method comprising:
- providing a compound semiconductor substrate;
- evaporating a layer of tantalum nitride ($TaN_x$) onto the compound semiconductor substrate using electron beam evaporation in a first processing step and using a first tool;
- evaporating a first layer of titanium (Ti) onto the layer of $TaN_x$ using electron beam evaporation in the first processing step and using the first tool;
- evaporating a layer of gold (Au) onto the first layer of Ti using electron beam evaporation in the first processing step and using the first tool; and
- evaporating a second layer of Ti onto the layer of Au using electron beam evaporation.

* * * * *